(12) United States Patent
Kokame

(10) Patent No.: US 10,861,907 B2
(45) Date of Patent: Dec. 8, 2020

(54) DISPLAY DEVICE AND METHOD OF MANUFACTURING A DISPLAY DEVICE

(71) Applicant: Japan Display Inc., Minato-ku (JP)

(72) Inventor: Hiraaki Kokame, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 95 days.

(21) Appl. No.: 15/943,767

(22) Filed: Apr. 3, 2018

(65) Prior Publication Data

US 2018/0301517 A1    Oct. 18, 2018

(30) Foreign Application Priority Data

Apr. 12, 2017   (JP) .................. 2017-078827

(51) Int. Cl.
*H01L 27/32*     (2006.01)
*H01L 51/52*     (2006.01)
*G06F 3/041*     (2006.01)

(52) U.S. Cl.
CPC .......... *H01L 27/323* (2013.01); *G06F 3/0412* (2013.01); *H01L 27/3276* (2013.01); *H01L 51/5203* (2013.01); *H01L 51/5253* (2013.01)

(58) Field of Classification Search
None
See application file for complete search history.

(56) References Cited

U.S. PATENT DOCUMENTS

2009/0195152 A1 *  8/2009  Sawano ................. B82Y 20/00
                                                    313/504
2019/0302959 A1 * 10/2019  Clark .................... G06F 3/0443

FOREIGN PATENT DOCUMENTS

JP          2003-99193          4/2003

* cited by examiner

*Primary Examiner* — Brian M Butcher
(74) *Attorney, Agent, or Firm* — Oblon, McClelland, Maier & Neustadt, L.L.P.

(57) ABSTRACT

A display device according to an embodiment of the present invention includes: a substrate; a plurality of pixels arranged on the substrate; an insulating layer which covers the plurality of pixels; and a conductive layer which is located at an opposite side of the insulating layer from the plurality of pixels and covers the plurality of pixels.

13 Claims, 4 Drawing Sheets

DISPLAY DEVICE AND METHOD OF MANUFACTURING A DISPLAY DEVICE

CROSS-REFERENCE TO RELATED APPLICATION

The present application claims priority from Japanese Application JP2017-78827 filed on Apr. 12, 2017, the content of which is hereby incorporated by reference into this application.

BACKGROUND OF THE INVENTION

1. Field of the Invention

One or more embodiments of the present invention relate to a display device and a manufacturing method thereof.

2. Description of the Related Art

An organic electroluminescence (EL) display device has a display panel where a thin film transistor (TFT), an organic light emitting diode (OLED), and the like are formed on a substrate. A display panel like this generates electromagnetic noise, and may trigger, for example, a malfunction of an attached touch panel. With respect to such a problem, for example, in Japanese Patent Application Laid-Open No. 2003-099193, it is suggested to form an ITO film on a substrate of a touch panel part and a substrate of a display panel part.

SUMMARY OF THE INVENTION

However, there is a problem that a number of steps for manufacturing the ITO film as described above increases in a manufacturing process of the organic EL display device.

One or more embodiments of the present invention have an objective to provide a display device which suppresses a bad influence due to electromagnetic noises while having a good manufacturing efficiency, with regard to the above.

A display device according to an embodiment of the present invention includes: a substrate; a plurality of pixels arranged on the substrate; an insulating layer which covers the plurality of pixels; and a conductive layer which is located at an opposite side of the insulating layer from the plurality of pixels and covers the plurality of pixels.

In one embodiment of the present invention, the conductive layer contains binder resin.

In one embodiment of the present invention, the conductive layer includes a nanowire and/or a nanotube.

In one embodiment of the present invention, a sheet resistance of the conductive layer is 5000 per square or less.

In one embodiment of the present invention, a touch panel is positioned at an opposite side of the conductive layer from the insulating layer.

In one embodiment of the present invention, the conductive layer contains resin and a conductive material.

A display device according to another embodiment of the present invention includes: a plurality of pixels each of which has a lower electrode, a light emitting electrode on the lower electrode, and an upper electrode on the light emitting layer; a sealing layer which is positioned on the upper electrode and covers the plurality of pixels; a conductive layer which is positioned at an opposite side of the sealing layer from the plurality of pixels and covers the plurality of pixels; and a touch panel which is positioned at an opposite side of the conductive layer from the sealing layer.

According to another aspect of the present invention, a method of manufacturing a display device is provided. The method includes, forming a plurality of pixels each of which has a light emitting layer; forming a sealing layer which seals the plurality of pixels; forming a conductive layer on the sealing layer; and etching a part of the sealing layer by using the conductive layer as a mask. The sealing layer is formed so as to extend over both of a display area which includes the plurality of pixels and an outside area which is outside the display area, and the conductive layer is formed so as to extend over both of the display area and the outside area.

DETAILED DESCRIPTION OF THE INVENTION

Figure 1:
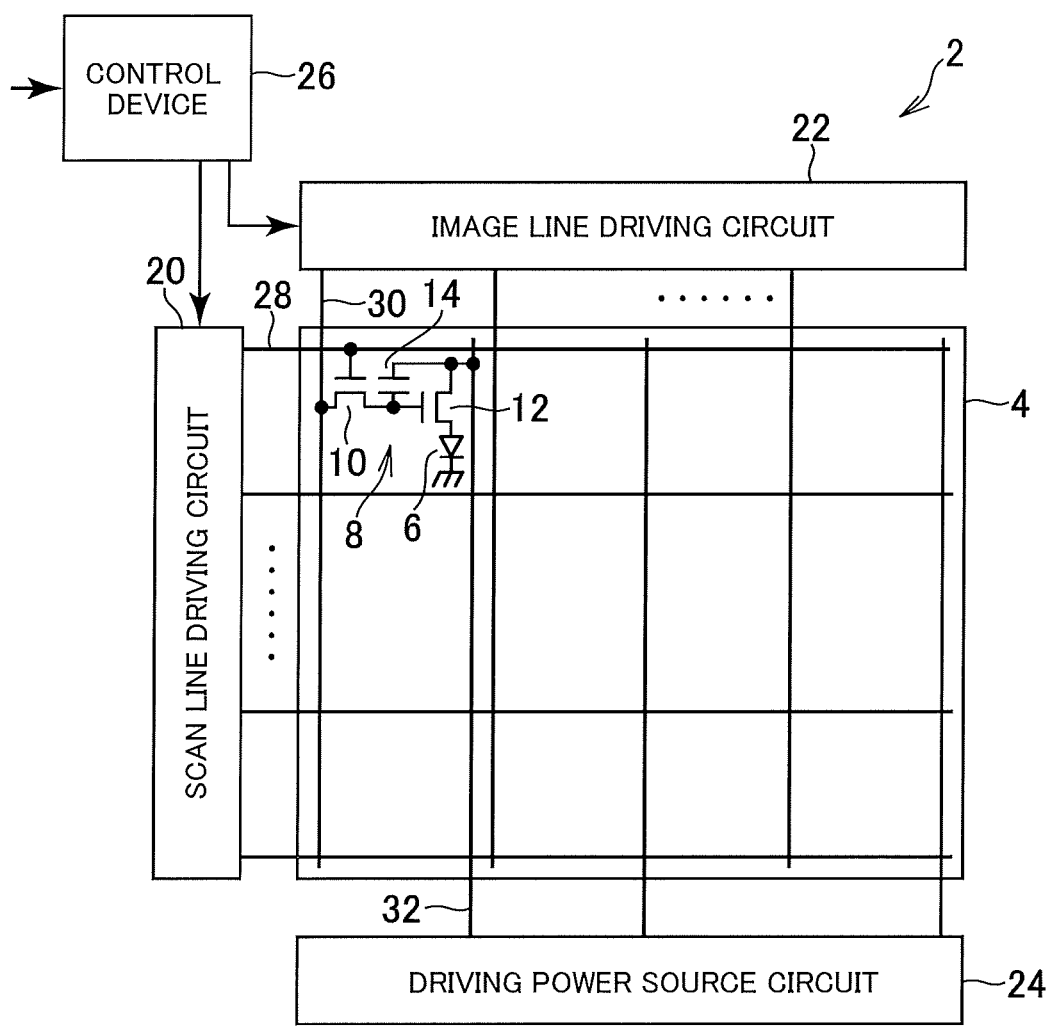
FIG. 1 is a schematic view of a schematic configuration of an organic EL display device according to an embodiment of the present invention.

Below, the respective embodiments of the present invention are explained with reference to the accompanying drawings. Note that the disclosed embodiments are merely examples, and an appropriate variation which a person skilled in the art can easily arrive at without departing from the spirit of the present invention is naturally included in the scope of the present invention. Further, while the width, thickness, shape, and the like of each part in the drawings may be illustrated schematically as compared with the actual embodiments in order to clarify the explanation, these are merely examples, and an interpretation of the present invention should not be limited thereto. Furthermore, in the specification and the respective drawings, the same reference symbols may be applied to elements similar to those which have already been illustrated in another drawing, and a detailed explanation of such elements may be omitted as appropriate.

FIG. 1 is a schematic view of a schematic configuration of an organic EL display device according to an embodiment of the present invention. An organic EL display device 2 is provided with a pixel array part 4 which displays an image, and a driving part which drives the pixel array part 4. The organic EL display device 2 has a display panel where a lamination structure of a TFT, an OLED, and the like is formed on a substrate. Note that the schematic view illustrated in FIG. 1 is an example, and the present embodiment is not limited thereto.

On the pixel array part 4, OLEDs 6 and pixel circuits 8 are arranged in a matrix form, in correspondence with the respective pixels. The pixel circuit 8 is composed of a plurality of TFTs 10 and 12, and a capacitor 14.

The driving part as described above includes a scan line driving circuit 20, an image line driving circuit 22, the driving power source circuit 24, and the control device 26, and drives the pixel circuit 8 to control light emission of the OLED 6.

The scan line driving circuit 20 is connected to a scan signal line 28 provided for each horizontal line of pixels (pixel row). The scan line driving circuit 20 selects scan signal lines 28 in order according to timing signals input from the control device 26, and applies an electric voltage for turning on the lighting TFT 10 to the selected scan signal line 28.

The image line driving circuit 22 is connected to an image signal line 30 provided for each vertical line of pixels (pixel column). The image line driving circuit 22 receives an input of an image signal from the control device 26, and in accordance with a selection of the scan signal line 28 by the scan line driving circuit 20, outputs an electric voltage according to the image signal for the selected pixel row to each image signal line 30. That electric voltage is written into the capacitor 14 via the lighting TFT 10 at the selected pixel row. The driving TFT 12 supplies the OLED 6 with an electric current according to the written electric voltage, and thus the OLED 6 of the pixel which corresponds to the selected scan signal line 28 emits light.

The driving power source circuit 24 is connected to a driving electric power supply line 32 provided for each pixel column, and supplies the OLED 6 with an electric current via the driving electric power supply line 32 and the driving TFT 12 in the selected pixel row.

Here, a lower electrode of the OLED 6 is connected to the driving TFT 12. Whereas, an upper electrode of each OLED 6 is composed of an electrode shared in common by the OLEDs 6 of all the pixels. In a case where the lower electrode is configured as an anode, a high electric potential is input thereto, and the upper electrode becomes a cathode and a low electric potential is input thereto. In a case where the lower electrode is configured as a cathode, a low electric potential is input thereto, and the upper electrode becomes an anode and a high electric potential is input thereto.

Figure 2:
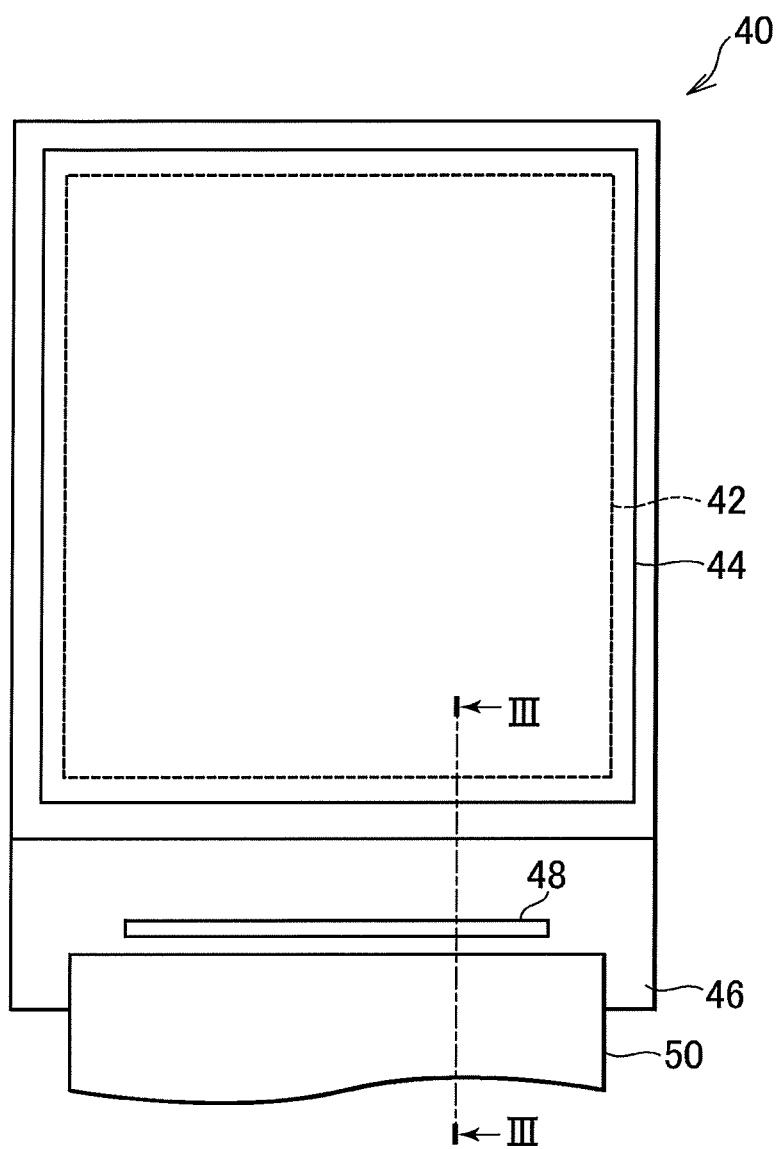
FIG. 2 is a schematic plan view of an example of a display panel of the organic EL display device illustrated in FIG. 1.

FIG. 2 is a schematic plan view of an example of the display panel of the organic display device illustrated in FIG. 1. The pixel array part 4 illustrated in FIG. 1 is provided in a display area 42 of the display panel 40, and as described above the OLEDs are arranged on the pixel array part 4. As described above, an upper electrode 44 which constitutes the OLED 6 is formed so as to be shared in common by the respective pixels and covers the entire display area 42.

On one side of the display panel 40 which has a rectangular shape, a component mounting area 46 is provided, and a wiring connected to the display area 42 is disposed thereon. Further, on the component mounting area 46 a driver integrated circuit (IC) 48 which constitutes the driving part is mounted, and an FPC 50 is connected to the component mounting area 46. The flexible printed circuit (FPC) 50 is connected to the control device 26, and other circuits 20, 22, and 24, and the like, and an IC is mounted on the FPC 50.

Figure 3:
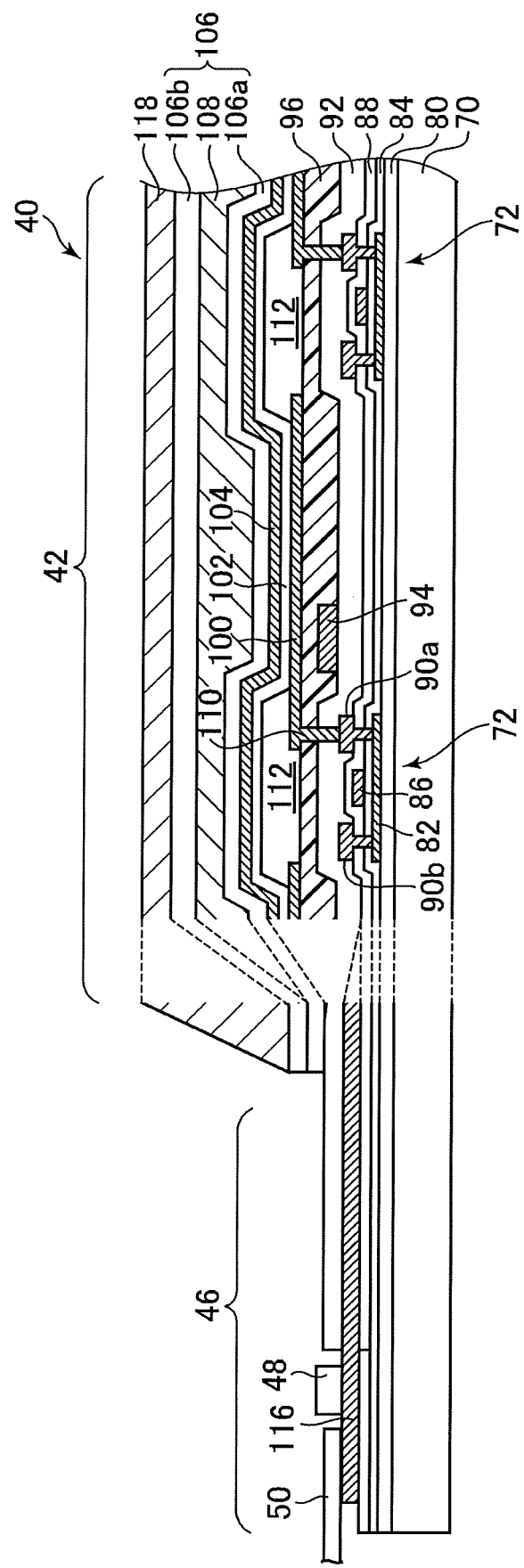
FIG. 3 is a view of an example of cross section of FIG. 2.

FIG. 3 is a view of an example of cross section of FIG. 2. The display panel 40 has a structure where a circuit layer composed of a TFT 72 and the like, the OLED 6, a sealing layer 106 which seals the OLED 6, a conductive layer 118, and the like are laminated on a substrate 70. The substrate 70 is composed of, for example, a glass board, or a resin film such as polyimide resin. In the present embodiment, the pixel array part 4 is a top emission type pixel array, and light generated in the OLED 6 is emitted to a side opposite from the substrate 70 side (in an upper direction in FIG. 3) with respect to the OLED 6. In a case where a colorization method of the organic EL display device 2 is set to the color filter method, the color filter is arranged over the sealing layer 106, for example. By letting white light generated in the OLED 6 go through this color filter, lights in colors such as red (R), green (G), and blue (B) are generated, for example.

On the circuit layer of the display area 42, the pixel circuit 8, the scan signal line 28, the image signal line 30, and the driving electric power supply line 32 which have been described above, and the like are formed. At least a part of the driving part can be formed as a circuit layer in an area adjacent to the display area 42, on the insulating base material 70. As described above, the driver IC 48 and the FPC 50 which constitute the driving part can be connected to a wiring 116 of the circuit layer in the component mounting area 46.

As illustrated in FIG. 3, on the substrate 70, an under-layer 80 which is formed of an inorganic insulating material is arranged. As the inorganic insulating material, for example, silicon nitride ($SiN_y$) silicon oxide ($SiO_y$), or a complex of these is used.

In the display area 42, with an interposition of the under-layer 80, a semiconductor area 82 to be a channel part and the source/drain part of the top gate type TFT 72 is formed on the substrate 70. The semiconductor area 82 is foilued of, for example, polysilicon (p-Si). The semiconductor area 82 is formed by, for example, providing a semiconductor layer (a p-Si film) on the substrate 70, patterning this semiconductor layer, and selectively leaving parts which are used in the circuit layer. Over the channel part of the TFT 72, a gate electrode 86 is arranged with an interposition of a gate insulating film 84. The gate insulating film 84 is typically formed of TEOS. The gate electrode 86 is formed by, for example, patterning a metal film formed by sputtering or the like. On the gate electrode 86, an interlayer insulating layer 88 is arranged so as to cover the gate electrode 86. The interlayer insulating layer 88 is formed of, for example, the inorganic insulating material as described above. In the semiconductor area 82 (p-Si) to be the source/drain part of the TFT 72, impurities are introduced by an ion injection, and further a source electrode 90a and a drain electrode 90b which are electrically connected thereto are formed, and thus the TFT 72 is formed.

On the TFT 72, an interlayer insulating film 92 is arranged. On the surface of the interlayer insulating film 92, a wiring 94 is arranged. The wiring 94 is formed by, for example, patterning a metal film formed by sputtering or the like. With a metal film which constitutes the wiring 94, and a metal film which is used to form the gate electrode 86, the source electrode 90a and the drain electrode 90b, for example, the wiring 116, and the scan signal line 28, the image signal line 30, and the driving power supply line 32 which are illustrated in FIG. 1 can be formed as a multilayer wiring structure. Thereon, a planarizing film 96 is formed, for example, of a resin material such as an acrylic resin, and in the display area 42, the OLED 6 is formed on the planarizing film 96.

The OLED 6 includes a lower electrode 100, an organic material layer 102, and an upper electrode 104. The organic material layer 102 includes, specifically, a hole transport layer, a light emitting layer, an electron transport layer, and the like. The OLED 6 is typically formed by laminating the lower electrode 100, the organic material layer 102, and the upper electrode 104 in this order from the substrate 70 side. In the present embodiment, the lower electrode 100 is an anode of the OLED, and the upper electrode 104 is a cathode.

If the TFT 72 illustrated in FIG. 3 is the driving TFT 12 having an n-channel, the lower electrode 100 is connected to the source electrode 90a of the TFT 72. Specifically, after forming the planarizing film 96 as described above, a contact hole 110 for connecting the lower electrode 100 to the TFT 72 is formed, and for example by patterning a conductive body part formed on the surface of the planarizing layer 96 and inside the contact hole 110, the lower electrode 100 connected to the TFT 72 is formed for each pixel.

On the structure as described above, a bank 112 which separates pixels is arranged. For example, after forming the lower electrode 100, the bank 112 is formed on a border of pixels, and in an effective area of a pixel surrounded by the bank 112 (an area where the lower electrode 100 is exposed), the organic material layer 102 and the upper electrode 104 are laminated. The upper electrode 104 is typically formed of a transparent electrode material.

On the upper electrode 104, a sealing layer 106 is arranged. The sealing layer 106 can function as, for example, a protection layer which protects the OLED 6 from moisture and the like, and therefore the sealing layer 106 is foiled to cover the whole of the display area 42. Further, on the sealing layer 106, a conductive layer 118 is arranged. The conductive layer 118 can also function as, for example, a protection layer which secures a mechanical strength of the surface of the display panel 40. Whereas, on the component mounting area 46, for example, no conductive layer 118 is provided so that the IC and the FPC are easily connected thereto. A wiring of the FPC 50 and a terminal of the driver IC 48 are electrically connected to, for example, the wiring 116.

Figure 4:
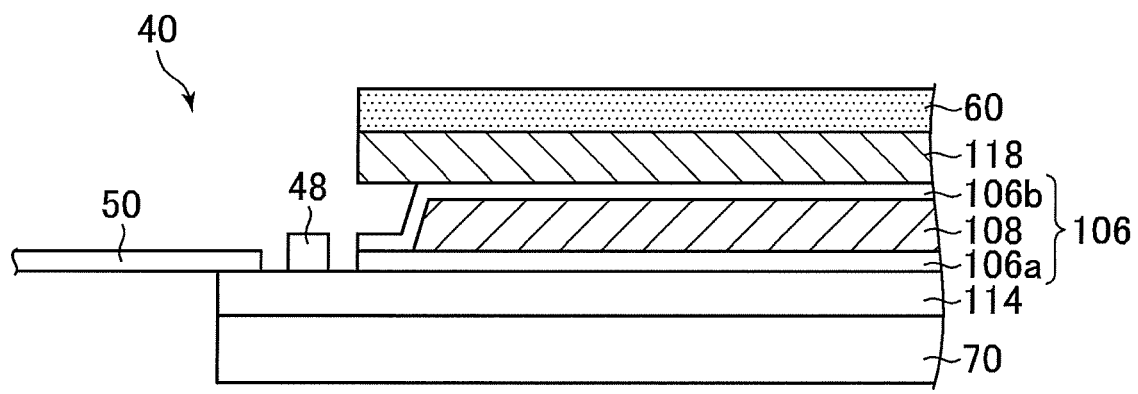
FIG. 4 is a schematic cross sectional view of an example of a state where a touch panel is placed on the display panel illustrated in FIG. 2.

As a method of installing a touch panel on the display device, a configuration of externally attaching the touch panel to the display panel (out-cell method), a configuration of providing the touch panel outside the display panel (for example, between the display panel and the polarizing plate arranged outside the display panel) and integrating the display panel and the touch panel (on-cell method), and a configuration of providing the touch panel inside the display panel (in-cell method) are known. In the present embodiment, the out-cell method or the on-cell method are adopted. Specifically, as illustrated in FIG. 4, the touch panel 60 is arranged on the conductive layer 118 of the display panel 40, and in this state, the display panel 40 is put inside a housing of the organic EL display device 2. Note that in FIG. 4, as the lamination structure of the display panel 40 illustrated in FIG. 3, a lamination structure from which the sealing layer 106 and the conductive layer 118 over the substrate 70 are omitted is illustrated as an upper structure layer 114, in a simplified manner.

The sealing layer 106 includes a first sealing layer (insulating layer) 106a, a planarizing layer 108, and a second sealing layer (insulating layer) 106b in this order from the substrate 70 side. As illustrated, no planarizing layer 108 exists at an edge part of the sealing layer 106 outside the display area 42, and the first sealing layer 106a and the second sealing layer 106b contact each other directly. The first sealing layer 106a and the second sealing layer 106b are respectively formed by forming a film of an inorganic insulating material such as $SiN_y$, for example, by the chemical vapor deposition (CVD) method so that the film becomes as thick as several μm or so, for example. The planarizing layer 108 is formed of, for example, a resin material such as an acrylic resin (in one embodiment, an organic insulating material). The thickness of the planarizing layer 108 is, for example, 10 μm to 50 μm.

The conductive layer 118 contains binder resin and a conductive material. As the binder resin, typically, acrylic resin is used. As a conductive material, for example, metal such as silver, gold, copper, and nickel, alloy of these (for example, Cu—Ni), carbon, metal oxide such as indium tin oxide (ITO), and the like are used. As a conductive material used together with the binder resin, any appropriate form can be adopted, but a nanowire (typically, a metal nanowire) and/or a nanotube (typically, a carbon nanotube) are preferably used. Of these, a metal nanowire is preferred especially, since, for example, the metal nanowire could have both of conductivity and transparency to be described later satisfactorily. Here, the nanowire is a conductive substance with a diameter of nanometer size having a fiber-like form with a solid structure, and the nanotube is a conductive substance with a diameter of nanometer size having a fiber-like form with a hollow structure. Thicknesses of the nanowire and the nanotube are, for example, 5 nm to 500 nm, and are preferably 5 nm to 50 nm. Lengths of the nanowire and the nanotube are, for example, 1 μm to 1000 μm, and is preferably 10 μm to 1000 μm.

The conductive layer 118 is preferably formed such that the sheet resistance is 500Ω per square or less, for sufficiently obtaining a shield effect against electromagnetic noises generated at the display part (the structure layer 114 under the sealing layer 106), for example. Further, the conductive layer 118 is preferably formed such that the transparency is secured (for example, a visible light transmission rate is 90% or more).

The conductive layer 118 is, for example, formed by applying an application material containing the binder resin and a conductive material on the sealing layer 106 (for example, by the inkjet method), and subjecting the application material to a post-treatment (for example, a heat curing treatment and a light curing treatment) as appropriate in accordance with a kind of the binder resin. The thickness of the conductive layer 118 is, for example, 3 μm to 50 μm.

In one embodiment, the conductive layer 118 is used as an etching mask in the manufacturing process. Specifically, as an etching mask used when removing the sealing layer 106 (the insulating material film) in the terminal area by etching (for example, dry etching), the conductive layer 118 is used. In this case, as illustrated, the edge of the conductive layer 118 is substantially aligned to the edge of the sealing layer 106. Like this, by making the resin material layer contain the conductive material, the shield effect with respect to the electromagnetic noises can be imparted to the resin material layer, while maintaining the manufacturing efficiency.

The present invention is not limited to the embodiments as have been described above, and various kinds of variations are acceptable. For example, the configurations explained as to the above embodiments can be replaced with a configuration which is substantially the same as the ones which have been explained regarding the embodiments described above, a configuration which exhibits the same technical effect, or a configuration which can achieve the same objective. Specifically, the planarizing layer 108 can contain the conductive material as described above.

It is understood that without departing from the spirit of the present invention, those skilled in the art can arrive at various kinds of variations and modifications, and such variations and modifications belong to the scope of the present invention. For example, each of the embodiments as described above to which addition, deletion, or design change of components, or addition, omission, or condition change of processes is suitably applied by those skilled in the art are also encompassed within the scope of the present invention as long as they fall within the spirit of the present invention.

What is claimed is:

1. A display device comprising:
   a substrate;
   a plurality of pixels arranged on the substrate;
   an insulating layer which covers the plurality of pixels; and
   a conductive layer which is located at an opposite side of the insulating layer from the plurality of pixels and covers the plurality of pixels,
   wherein each of the plurality of pixels includes a lower electrode, a light emitting layer on the lower electrode, and an upper electrode on the light emitting layer, and
   the insulating layer is positioned on the upper electrode, and is a sealing layer which seals the light emitting layer,
   wherein a display area including the plurality of pixels is positioned over the substrate,
   the sealing layer includes a first inorganic insulating layer, a second inorganic insulating layer which is positioned at an opposite side of the first inorganic insulating layer from the upper electrode, and an organic insulating layer which is positioned between the first inorganic insulating layer and the second inorganic insulating layer,
   the second inorganic insulating layer includes a region which directly contacts with the first inorganic insulating layer outside the display area, and
   the region directly contacts with the conductive layer.

2. A display device according to claim 1, wherein
   a display area including the plurality of pixels is positioned over the substrate,
   the insulating layer covers the display area,
   a part of the insulating layer is positioned outside the display area,
   a part of the conductive layer is positioned outside the display area, and
   an edge of the part of the insulating layer and an edge of the part of the conductive layer overlap each other in a plan view.

3. A display device according to claim 1, wherein
   an edge of the region, an edge of the first inorganic layer, and an edge of the conductive layer overlap one another in a planar view.

4. A display device according to claim 1, wherein
   a touch panel is positioned at an opposite side of the conductive layer from the insulating layer.

5. A display device according to claim 1, wherein
   the conductive layer contains binder resin.

6. A display device according to claim 1, wherein
   the conductive layer includes at least one of: a nanowire; a nanotube.

7. A display device according to claim 1, wherein
   the conductive layer contains resin and a conductive material.

8. A display device according to claim 1, wherein
   a sheet resistance of the conductive layer is 500Ω per square or less.

9. A manufacturing method of a display device, comprising:
   forming a plurality of pixels each of which has a light emitting layer;
   forming a sealing layer which seals the plurality of pixels;
   forming a conductive layer m the sealing layer; and
   etching a part of the sealing layer by using the conductive layer as a mask, wherein
   the sealing layer is formed so as to extend over both of a display area which includes the plurality of pixels and an outside area which is outside the display area, and
   the conductive layer is formed so as to extend over both of the display area and the outside area.

10. A manufacturing method of the display device according to claim 9, wherein
    a touch panel is arranged on the conductive layer.

11. A manufacturing method of the display device according to claim 9, wherein
    in the forming of the sealing layer, a first inorganic insulating layer is formed, an organic insulating layer is formed on the first inorganic insulating layer, and a second inorganic insulating layer is formed on the organic insulating layer,
    the first inorganic insulating layer and the second inorganic insulating layer have a contact area where the first inorganic insulating layer and the second inorganic insulating layer directly contacts with each other in the outside area, and
    in the etching, a part of the contact area is etched.

12. A manufacturing method of the display device according to claim 9, wherein
    the conductive layer contains binder resin.

13. A manufacturing method of the display device according to claim 9 wherein
    the conductive layer includes a nanowire and/or a nanotube.

* * * * *